(12) United States Patent
Hsiaw et al.

(10) Patent No.: US 6,869,836 B1
(45) Date of Patent: Mar. 22, 2005

(54) ILD STACK WITH IMPROVED CMP RESULTS

(75) Inventors: Han-Ti Hsiaw, Daliao Township, Kaohsiung County (TW); Shwang-Ming Jeng, Hsin-chiu (TW); Shih-Ming Wang, Tainan (TW); Fu-Chi Hsu, Sinyuan Township, Pingtung County (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/672,769

(22) Filed: Sep. 26, 2003

(51) Int. Cl.[7] .................... H01L 21/336; H01L 21/8234

(52) U.S. Cl. ....................................... 438/197; 438/692
(58) Field of Search ................................ 438/197, 198, 438/199, 680, 681, 683, 687, 688, 700, 712, 745, 954, 692

(56) References Cited

U.S. PATENT DOCUMENTS

| | | | | | |
|---|---|---|---|---|---|
| 5,895,239 A | * | 4/1999 | Jeng et al. | ................... | 438/239 |
| 5,950,102 A | * | 9/1999 | Lee | ............................. | 438/619 |
| 6,274,424 B1 | * | 8/2001 | White et al. | ................. | 438/239 |

* cited by examiner

*Primary Examiner*—David Nhu
(74) *Attorney, Agent, or Firm*—Tung & Associates

(57) ABSTRACT

An ILD dielectric layer stack and method for forming the same, the method includes a semiconductor substrate including CMOS transistors with gate electrode portions; depositing a first layer including phosphorous doped $SiO_2$ over the semiconductor substrate to a thickness sufficient to cover the gate electrode portions including intervening gaps; depositing a second layer of undoped $SiO_2$ over and contacting the first layer to a thickness sufficient to leave a second layer thickness portion overlying the first layer following a subsequent oxide chemical mechanical polish (CMP) planarization process; carrying out the oxide CMP process to planarize the second layer and leave the second layer thickness portion; and forming metal filled local interconnects extending through a thickness portion of the first and second layers.

23 Claims, 2 Drawing Sheets

ILD STACK WITH IMPROVED CMP RESULTS

FIELD OF THE INVENTION

This invention generally relates to semiconductor processing methods including formation of metallization plugs and more particularly to an ILD stack and method for forming the same to with improved CMP thickness control and reduced metal residue following plug formation process.

BACKGROUND OF THE INVENTION

Metallization interconnects are critical to the proper electronic function of semiconductor devices. Several advances in semiconductor processing have been aimed at improving signal transport speed by reducing metal interconnect resistivities and improving resistance to electromigration effects. Copper has increasingly become a metal of choice in, for example, upper levels of metallization in a multi-level semiconductor device due to its low resistivity and higher resistance to electromigration. Tungsten (W), however, n is still preferred for use in the lower metallization layers adjacent to the silicon substrate since it provides an effective diffusion barrier to metal diffusion from overlying metallization layers to react with the silicon substrate. Tungsten further has high resistance to electromigration and can effectively be used to fill high aspect ratio vias by chemical vapor deposition (CVD) processes.

According to prior art processes, an oxide layer, referred to as a first layer oxide or an inter-layer dielectric (ILD) is deposited following forming of CMOS transistors with protruding polysilicon gate electrodes. The first ILD layer fills the gaps between the polysilicon electrodes, followed by a CMP process to planarize the layer prior to forming tungsten plugs. Problems with prior art processes include the practice of using a doped oxide, for example doped with phosphorous or boron to provide a binary glass which improved the dielectric properties and which be heated and flowed following deposition to improved the topography planarity of the surface. Problems with using binary glasses is that they are frequently much softer than $SiO_2$ and have a high removal rate in a CMP process thereby making control of a final thickness of the first ILD layer including tungsten plugs difficult to control.

Therefore, there is a need in the semiconductor processing art to develop an improved ILD layer stack to maintain the advantages of doped oxide binary glasses while improving a structural stability including improved CMP thickness control.

It is therefore an object of the invention to provide an improved ILD layer stack to maintain the advantages of doped oxide binary glasses while improving a structural stability including improved CMP thickness control, while overcoming other shortcomings of the prior art.

SUMMARY OF THE INVENTION

To achieve the foregoing and other objects, and in accordance with the purposes of the present invention, as embodied and broadly described herein, the present invention provides an ILD dielectric layer stack and method for forming the same to allow improved control over thickness and reduced metallic residue.

In a first embodiment, the method includes providing a semiconductor substrate including CMOS transistors including gate electrode portions; depositing a first layer including phosphorous doped $SiO_2$ over the semiconductor substrate to a thickness sufficient to fully cover the gate electrode portions including intervening gaps; depositing a second layer of undoped $SiO_2$ over and contacting the first layer to a thickness sufficient to leave a second layer thickness portion overlying the first layer following a subsequent oxide chemical mechanical polish (CMP) planarization process; carrying out the oxide CMP process to planarize the second layer and leave the second layer thickness portion; and, forming metal filled local interconnects extending through a thickness portion of the first and second layers.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained by reference to formation of a first ILD layer, it will be appreciated that the process may be equally applied to subsequent overlying ILD layers including a tungsten plug formation process.

Figure 1A:
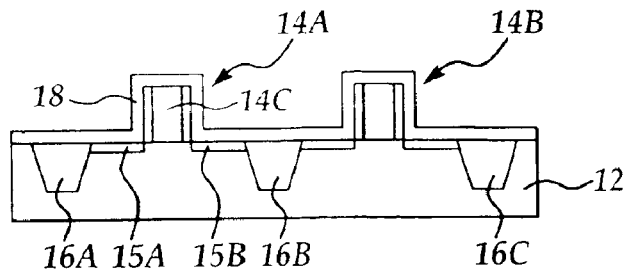
FIGS. 1A–1E are cross sectional side view representations of a portion of a semiconductor wafer at stages in device manufacture according to the method of the present invention.

Referring to FIGS. 1A–1E, in an exemplary embodiment of the method of the present invention, side view portions of a semiconductor device are shown at stages in a semiconductor device integrated circuit manufacturing process. Referring to FIG. 1A, is shown a conventional semiconductor substrate 12, for example silicon, including CMOS transistors 14A and 14B with protruding polysilicon gate electrode portions, e.g., 14C and including adjacent source and drain regions e.g., 15A and 15B, as well as shallow trench isolation (STI) structures e.g., 16A 16B, and 16C, all formed by conventional processes.

Still referring to FIG. 1A, a layer of silicon nitride 18 is deposited by conventional processes, for example LPCVD over active regions of the device to protect the CMOS transistor features and semiconductor substrate surface from diffusion of dopants included in a subsequently deposited overlying first ILD layer, also referred to as a local interconnect (LI) dielectric.

Figure 1B:
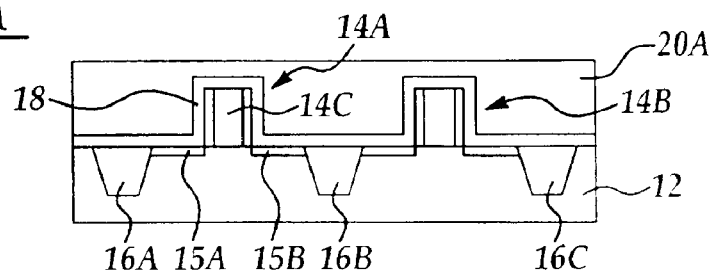

Referring to FIG. 1B, following deposition of the silicon nitride layer 18, according to an aspect of the present invention, a first layer 20A of an ILD layer stack is deposited to a thickness at least thick enough to cover a height of the protruding polysilicon electrode gate portions e.g., 14C and fill intervening gaps between CMOS transistors 14A and 14B. Preferably, the first ILD layer 20A is deposited to a thickness of between about 4000 Angstroms and about 6000 Angstroms, more preferably about 5500 Angstroms to fill the gaps between protruding polysilicon electrodes e.g., 14C of the CMOS transistors e.g., 14A and 14B. Preferably, the first ILD layer portion 20A is formed of a phosphorous doped $SiO_2$ according to a conventional HDP-CVD process using phosphine ($PH_3$) or TMP, more preferably $PH_3$, at a temperature of about 550° C. to about 650° C. to form phosphosilicate glass (PSG). Preferably, the PSG layer has a phosphorous doping level of about 2.5 weight % to about 4.5 weight % of phosphorous, more preferably from about 3.0 to about 4.0 weight % phosphorous.

Figure 1C:
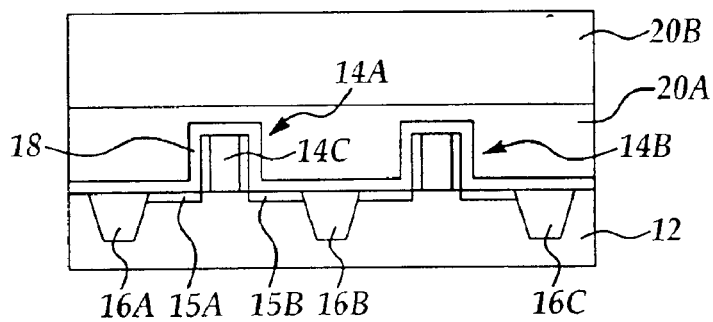

Referring to FIG. 1C, according to another aspect of the present invention, a second ILD layer 20B of the ILD stack, formed of undoped $SiO_2$ is deposited over the first ILD layer (PSG layer) at a thickness such that a subsequent CMP planarization process leaves from about 500 Angstroms to about 1000 Angstroms of the second ILD layer 20B.

For example, the thickness of the second ILD layer 20B is preferably between about 4000 Angstroms to about 6000 Angstroms. The second ILD layer 20B is preferably formed in-situ by an HDP-CVD process where the phosphorous precursor flow, e.g., $PH_3$ is stopped to formed undoped silicate glass (USG), but may be formed in a separate PECVD process using silane and oxygen precursor or TEOS precursors to respectively form PEOX and PETEOS Oxide.

Figure 1D:
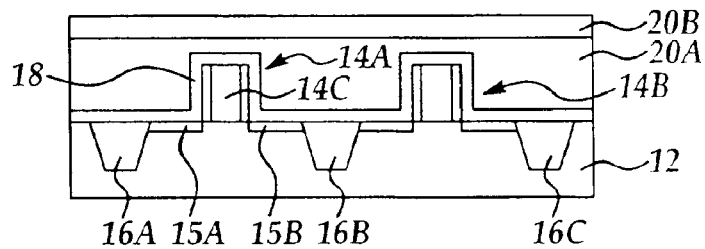

Referring to FIG. 1D, according to another aspect of the present invention, following deposition of the capping USG layer 20B, a conventional CMP oxide process is carried out to remove the USG layer 20B to leave from about 500 Angstroms to about 1000 Angstroms of the USG layer 20B remaining overlying the PSG layer 20A.

Figure 1E:
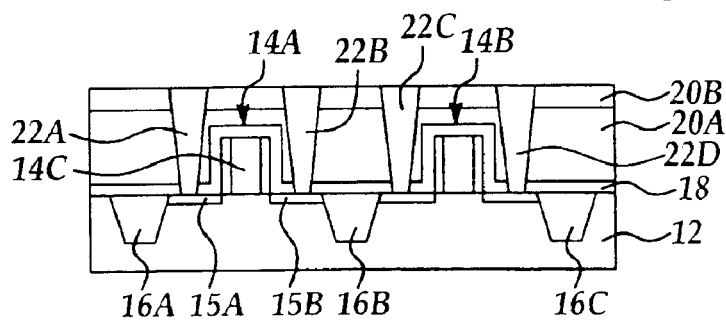

Referring to FIG. 1E, conventional processes including photolithographically patterning and RIE etching the ILD layer stack including layers 20A and 20B is carried out to form trenches followed by deposition of a barrier layer e.g., Ti/TiN (not shown), and sputter deposition of tungsten (W) to fill the trenches to form local interconnects e.g., 22A, 22B, 22C, and 22D. Following deposition of the tungsten metal filling layer, a conventional W CMP process including an optional oxide buffing process is carried out to polish the tungsten back to expose the USG layer 20B.

Following the W CMP process, a batch wafer cleaning process is carried out. For example, the batch wafer cleaning process includes dipping a plurality, or batch of process wafers in an HF containing solution, for example, including about 5 wt. % to about 1.5 wt. % of 99.99% HF in deionized water with respect to a cleaning solution volume.

According to the present invention, the various and numerous advantages realized over prior art processes include better control over an ILD layer thickness following the CMP process while realizing the advantages of superior gap fill ability of the PSG layer. For example, the removal rate of PSG material in a CMP process has found to depend strongly on the amount of phosphorous in the ILD layer. Since the wt % of phosphorous in the PSG film, and therefore the removal rate in a CMP process tends to vary from wafer to wafer, controlling the final ILD layer thickness of a PSG ILD layer has been found to be difficult to control. For example small variations in phosphorus content in a PSG layer between about 2.0 wt % and about 5.0 wt % results in a removal rate variation of about 100 Angstroms/minute for a change of about 0.5 wt % phosphorous, and removal rates varying between about 1400 Angstroms/min and about 2000 Angstroms/min. By contrast, USG or undoped $SiO_2$ has a relatively lower and uniform material removal rate from wafer to wafer.

By providing the undoped $SiO_2$, e.g., USG capping layer according to the present invention, improved structural stability and a relatively uniform CMP etching rate from wafer to wafer are achieved. The ILD layer stack including the USG layer stack according to the present invention provides improved ILD layer thickness control and therefore reliability and reproducibility of an ILD layer thickness following an ILD layer CMP process while maintaining the gap filling ability of PSG in the first layer of the ILD layer stack.

Yet another advantage realized by the present invention over prior art processes is that it has been found that the amount of residual metal, from both the tungsten plugs and residual CMP slurry particles (e.g., Fe, Ni, Co, w) adhering to the exposed upper portion of the ILD layer following tungsten CMP and oxide buffing is reduced by providing the undoped $SiO_2$ capping layer according to preferred embodiments. It is believed that the reason for reduction of metallic residue is due to the decreased electrostatic charge induced in the USG layer compared to PSG layer by the W CMP process. For example, it has been found that the PSG develops an electrostatic surface charge that is about 10 times that of USG which develops about zero electrostatic charge following a typical W CMP process.

Yet an additional advantage realized by the present invention, is that the wet cleaning (etching) process following W CMP, allows a batch wafer cleaning process to be carried out as opposed to a single wafer process according to the prior art. For example, similar to the variability of the material removal rate for PSG in a CMP process, variation in wet etching rates of PSG layer produced in the post W CMP cleaning process, require single water cleaning processes to reduce wafer to wafer variation. By using a USG capping layer over the PSG layer, a wet etching rate of the USG layer occurring in the cleaning process is relatively more uniform between wafers compared to a PSG layer, thereby allowing a wafer batch cleaning process to be undertaken which advantageously increases throughput by about 30%.

Figure 2:
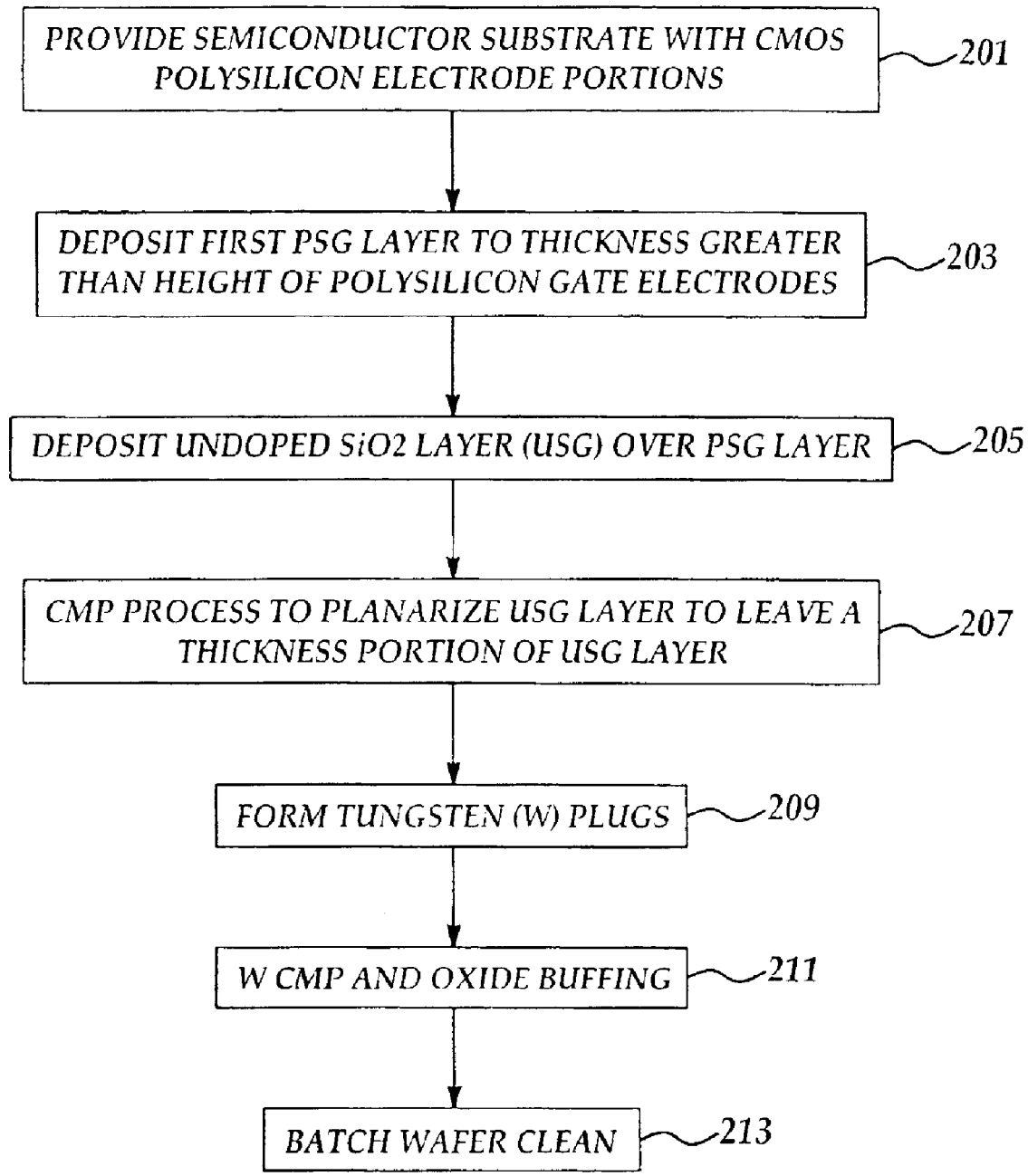
FIG. 2 is a process flow diagram including several embodiments of the present invention.

Referring to FIG. 2 is a process flow diagram including several embodiments of the present invention. In a first process 201, a semiconductor substrate including CMOS transistors having protruding polysilicon electrode portions is provided. In process 203, a first PSG ILD layer of an ILD layer stack is deposited by an HDP-CVD process to a thickness greater than the height of the protruding polysilicon electrode portions. In process 205, a second layer of the ILD layer stack, a capping layer of USG is deposited over the PSG layer. In process 207, an oxide CMP process is carried out to planarize the ILD layer stack leaving a thickness portion of the USG layer overlying the PSG layer. In process 209, tungsten plugs are formed. In process 211, a W CMP process and oxide buffing process is carried out to expose the USG layer. In process 213, a wafer batch wet cleaning process is carried out.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method of forming an ILD dielectric layer stack to allow improved local interconnect formation comprising the steps of:

providing a semiconductor substrate comprising CMOS transistors comprising gate electrode portions;

depositing a first layer comprising phosphorous doped $SiO_2$ over the semiconductor substrate to a thickness sufficient to fully cover the gate electrode portions including intervening gaps;

depositing a second layer of undoped $SiO_2$ over and contacting the first layer to a thickness sufficient to leave a second layer thickness portion overlying the first layer following a subsequent oxide chemical mechanical polish (CMP) planarization process;

carrying out the oxide CMP process to planarize the second layer and leave the second layer thickness portion; and, forming metal filled local interconnects extending through a thickness portion of the first and second layers.

2. The method of claim 1, wherein the step of forming metal filled local interconnects comprises:

forming local interconnect trenches;

depositing tungsten or an alloy thereof to fill the local interconnect trenches;

carrying out a tungsten CMP process to expose the second layer; and, carrying out a batch wafer cleaning process.

3. The method of claim 2, wherein the batch wafer cleaning process comprises an HF containing solution.

4. The method of claim 1, wherein the metal is formed of tungsten or an alloy thereof.

5. The method of claim 1, wherein the step of depositing a first layer comprises an HDP-CVD process comprising phosphine ($PH_3$) source gas.

6. The method of claim 1, wherein the step of depositing a second layer comprises a CVD process selected from the group consisting of PECVD and HDP-CVD.

7. The method of claim 1, wherein the wherein the step of depositing a second layer comprises an in-situ HDP-CVD process with respect to the step of depositing a first layer.

8. The method of claim 1, wherein the first layer is formed with a phosphorous content of from about 2.5 weight % to about 4.5 weight %.

9. The method of claim 1, wherein the second layer comprises undoped $SiO_2$ selected from the group consisting of USG, PEOX, and PETEOS oxide.

10. The method of claim 1, wherein the first layer is deposited to a thickness of about 4000 to about 6000 Angstroms.

11. The method of claim 1, wherein the second layer is deposited to a thickness of about 4000 to about 6000 Angstroms.

12. The method of claim 1, wherein the second layer thickness portion is from about 500 Angstroms to about 1000 Angstroms.

13. A method of forming local interconnect (LI) dielectric layer stack to allow improved control over thickness and reduced metallic residue comprising the steps of:

providing a semiconductor substrate comprising CMOS transistors comprising gate electrode portions;

depositing a first layer comprising phosphosilicate glass (PSG) over the semiconductor substrate to a thickness sufficient to fully cover the gate electrode portions including intervening gaps;

depositing a second layer of undoped $SiO_2$ over and contacting the first layer to a thickness sufficient to leave a second layer thickness portion overlying the first layer following a subsequent oxide chemical mechanical polish (CMP) planarization process;

carrying out the oxide CMP process to planarize the second layer and leave the second layer thickness portion;

forming LI trenches extending through a thickness of the first and second layers;

depositing tungsten to fill the LI trenches; and, carrying out a tungsten CMP process to expose the second layer.

14. The method of claim 13, further comprising carrying out a batch wafer cleaning process.

15. The method of claim 14, wherein the batch wafer cleaning process comprises etching a portion of the second layer.

16. The method of claim 1, wherein the step of depositing a first layer comprises an HDP-CVD process comprising phosphine ($PH_3$) source gas.

17. The method of claim 1, wherein the wherein the step of depositing a second layer comprises an in-situ HDP-CVD process with respect to the step of depositing a first layer.

18. The method of claim 1, wherein the step of depositing a second layer comprises a PECVD process.

19. The method of claim 1, wherein the first layer is formed with a phosphorous content of from about 2.5 weight % to about 4.5 weight %.

20. The method of claim 1, wherein the second layer comprises undoped $SiO_2$ selected from the group consisting of USG, PEOX, and PETEOS oxide.

21. The method of claim 1, wherein the first layer is deposited to a thickness of about 4000 to about 6000 Angstroms.

22. The method of claim 1, wherein the second layer is deposited to a thickness of about 4000 to about 6000 Angstroms.

23. The method of claim 1, wherein the second layer thickness portion is from about 500 Angstroms to about 1000 Angstroms.

* * * * *